United States Patent
Asami et al.

[11] Patent Number: 5,959,401
[45] Date of Patent: Sep. 28, 1999

[54] LIGHT-EMITTING SEMICONDUCTOR DEVICE USING GROUP III NITRIDE COMPOUND

[75] Inventors: Shinya Asami; Masayoshi Koike, both of Alchi-ken, Japan

[73] Assignee: Toyoda Gosei Co., Ltd., Aichi-ken, Japan

[21] Appl. No.: 08/861,116

[22] Filed: May 21, 1997

[30] Foreign Application Priority Data

May 21, 1996 [JP] Japan ................................. 8-150272

[51] Int. Cl.$^6$ ................................................. H01J 1/62
[52] U.S. Cl. .................. 313/503; 313/501; 313/499; 313/504
[58] Field of Search ......................... 313/503, 501, 313/499, 504

[56] References Cited

U.S. PATENT DOCUMENTS 5,650,641  7/1997  Sassa et al. ............................... 257/88
5,700,713  12/1997  Yamakazi et al. ...................... 437/129
5,777,350  7/1998  Nakamura et al. .

OTHER PUBLICATIONS

Nakamura et al. "High–Brightness InGaN/AlGaN Double–Heterostructure Blue–Green–Light–Emitting Diodes", J. Appl. Phys. 76 (12), Dec. 1994, pp. 8189–8191.

Nakamura et al. "Candela–class High–Brightness InGaN/AlGaN Double–Heterostructure Blue–Light–Emitting Diodes", Appl. Phys. Lett. 64 (13), Mar. 1994, pp. 1687–1689.

Nakamura et al. Superbright Green InGaN Single–Quantum–Well–Structure Light–Emitting Diodes, Jpn. J. Appl. Phys., vol. 34, Part 2, No. 10B, (1995) pp. 1332–1335.

*Primary Examiner*—Sandra O'Shea
*Assistant Examiner*—Michael J. Smith
*Attorney, Agent, or Firm*—Pillsbury Madison & Sutro

[57] ABSTRACT

A light-emitting semiconductor device consecutively includes a sapphire substrate, an AlN buffer layer, a silicon (Si) doped n$^+$-layer GaN, a Si-doped n-type GaN, a zinc (Zn) and Si-doped In$_{0.20}$Ga$_{0.80}$N emission layer, a magnesium (Mg) doped p-type Al$_{0.08}$Ga$_{0.92}$N layer as a cladding layer, an Mg-doped p-type GaN layer as a first contact layer, and an Mg-doped p$^+$-type GaN layer as a second contact layer. The cladding layer and the first and second contact layers have a total thickness of 10 nm to 150 nm which is thinner than that of a conventional p-layers by a half to one thirtieth. The emission layer is exposed to high growth temperature for 1.3 min. to 20 min. which is shorter than that of the conventional emission layer by a half to one thirtieth. As a result, crystallinity of the emission layer is improved, because it is prevented that In of the emission layer diffuses into the cladding and the contact layers, that N of the emission layer evaporates, and that Mg of the cladding and the contact layers diffuses into the emission layer.

13 Claims, 3 Drawing Sheets

LIGHT-EMITTING SEMICONDUCTOR DEVICE USING GROUP III NITRIDE COMPOUND

BACKGROUND OF THE INVENTION

1. Field of the Invention

The present invention relates to a light-emitting semiconductor device that emits blue or green light and uses a group III nitride compound. Especially, the present invention relates to the operational whose device characteristics and reliability are improved.

2. Description of the Related Art

It has been known that an aluminum gallium indium nitride (AlGaInN) compound semiconductor may be used to obtain a light-emitting device which emits blue light or another color of light in the short wavelength region. This device is useful because of its high luminous efficiency resulting from direct electron transition and because of its ability to emit blue light, which is one of the three primary colors.

An AlGaInN compound semiconductor layer with p-type conduction can be obtained by doping magnesium (Mg) and irradiating an electron beam thereto or carrying out heat treatment thereto. As a result, a light-emitting diode (LED) with a double hetero p-n junction structure which includes an aluminum gallium nitride (AlGaN) cladding layer of p-type, a zinc (Zn) and silicon (Si) doped emission layer made of indium gallium nitride (InGaN) and a GaN layer of n-type, becomes commercially useful.

This conventional LED has a sapphire substrate on which seven layers are consecutively forced: a buffer layer; an $n^+$-layer of GaN heavily doped with Si; a cladding layer of GaN with n-type conduction; an emission layer of InGaN; a cladding layer of AlGaN with p-type conduction: a first contact layer of GaN with p-type conduction; and a second contact layer of GaN with $p^+$type conduction. The emission layer is formed to have a 100 nm thickness under the growth temperature of 800° C. The cladding layer is formed to have a 50 nm thickness under the growth temperature of 1100° C. The first contact layer is formed to have a 200 nm thickness under the growth temperature of 1100° C. The second contact layer is formed to have a 50 nm under the growth temperature of 1100° C. It takes about 40 min. to grow the cladding layer and the two contact layers totally.

Still, there exists a problem in luminous intensity of the conventional LED and further improvements are necessary.

SUMMARY OF THE INVENTION

It has been discovered that crystallinity of an emission layer is deteriorated by an exposure to a high temperature for a long time during vapor phase deposition processes to form p-type layers. The p-type layers are the cladding layer, and the two contact layers and are designed to have wider band gaps than the emission layer so as to confine carriers therein and improve luminous intensity. Accordingly, the p-type layers have a smaller composition ratio of In than the emission layer and a larger composition ratio of Al than the emission layer. As a result, the growth temperature necessarily becomes high when the p-type layers are grown on the emission layer. Concretely, the p-type layers have about a 300 nm thickness as a whole. Although the emission layer is formed at around 800° C., the p-type layers are formed under a higher temperature than the emission layer, or around 1100° C. for a total of 40 min. The inventors of the present invention have found that In in the emission layer diffuses into the adjacent p-type layer, or the cladding layer and that nitrogen (N) in the emission layer evaporates. Further, it is found that magnesium (Mg) doped into the p-type layers diffused into the emission layer. As a result, the crystallinity of the emission layer is deteriorated and the luminous intensity of the LED does not increase.

It is, therefore, an object of the present invention to solve the above problem and improve the luminous intensity of a light-emitting device using AlGaInN semiconductor, and to obtain a reliable semiconductor device with improved luminous intensity, device characteristics, and reliability.

According to the first aspect of the invention, there is provided a light-emitting device using group III nitride compound semiconductor which is constituted by:

an emission layer of group III nitride compound semiconductor satisfying the formula $Al_{x1}Ga_{y1}In_{1-x1-y1}N$, wherein $0 \leq x1 \leq 1$, $0 \leq y1 \leq 1$ and $0 \leq x1+y1 < 1$;

a cladding layer formed on said emission layer and made of group III nitride compound semiconductor satisfying the formula $Al_{x2}Ga_{y2}In_{1-x2-y2}N$, wherein $0 \leq x2 \leq 1$, $0 \leq y2 \leq 1$ and $0 \leq x2+y2 \leq 1$;

a contact layer formed on said cladding layer and made of group III nitride compound semiconductor satisfying the formula $Al_{x3}Ga_{y3}In_{1-x3-y3}N$, wherein $0 \leq x3 \leq 1$, $0 \leq y3 \leq 1$ and $0 \leq x3+y3 \leq 1$; and characterized in that the total thickness of the cladding layer and the contact layer is in the range of 10 nm to 150 nm.

According to the second aspect of the invention, the cladding layer is doped with an acceptor impurity and exhibits p-type conduction and the contact layer is doped with an acceptor impurity and exhibits p-type conduction.

According to the third aspect of the invention, the cladding layer is made of three elements compound satisfying the formula $Al_{y4}Ga_{1-y4}N$ where $0 \leq y4 \leq 1$.

According to the fourth aspect of the invention, the contact layer is made of gallium nitride (GaN).

According to the fifth aspect of the invention, each of the cladding layer and the contact layer is doped with magnesium (Mg).

According to the sixth aspect of the invention, the emission layer is doped with both an acceptor impurity and a donor impurity.

According to the seventh aspect of the invention, the emission layer is doped with zinc (Zn) and silicon (Si).

According to the eighth aspect of the invention, the emission layer has one of a single quantum well structure and a multi-quantum well structure.

The p-layers, or the cladding layer and the contact layers, of the present invention are formed on the emission layer with about 10 nm total to 150 nm thickness in range. That thickness is a half to one thirtieth of this of the conventional p-layers. Accordingly, the emission layer of the present invention is exposed to a high temperature for the duration of 1.3 min. to 20 min. This duration is a half to one thirtieth of that of the conventional emission layer. Accordingly, it is prevented that In of the emission layer diffuses into the cladding layer, that N of the emission layer evaporates, and that Mg of the cladding and the contact layers diffuses into the emission layer. When acceptor and donor impurities are doped into the emission layer, diffusion of the impurities into the cladding layer is also prevented. As a result, the crystallinity and luminous intensity of the emission layer is improved and the lifetime of the device grows longer.

Other objects, features, and characteristics of the present invention will become apparent upon consideration of the following description in the appended claims with reference to the accompanying drawings, all of which form a part of the specification, and wherein referenced numerals designate corresponding parts in the various figures.

DETAILED DESCRIPTION OF THE PREFERRED EMBODIMENT

The invention will be more fully understood by reference to the following examples.

EXAMPLE 1

Figure 1:
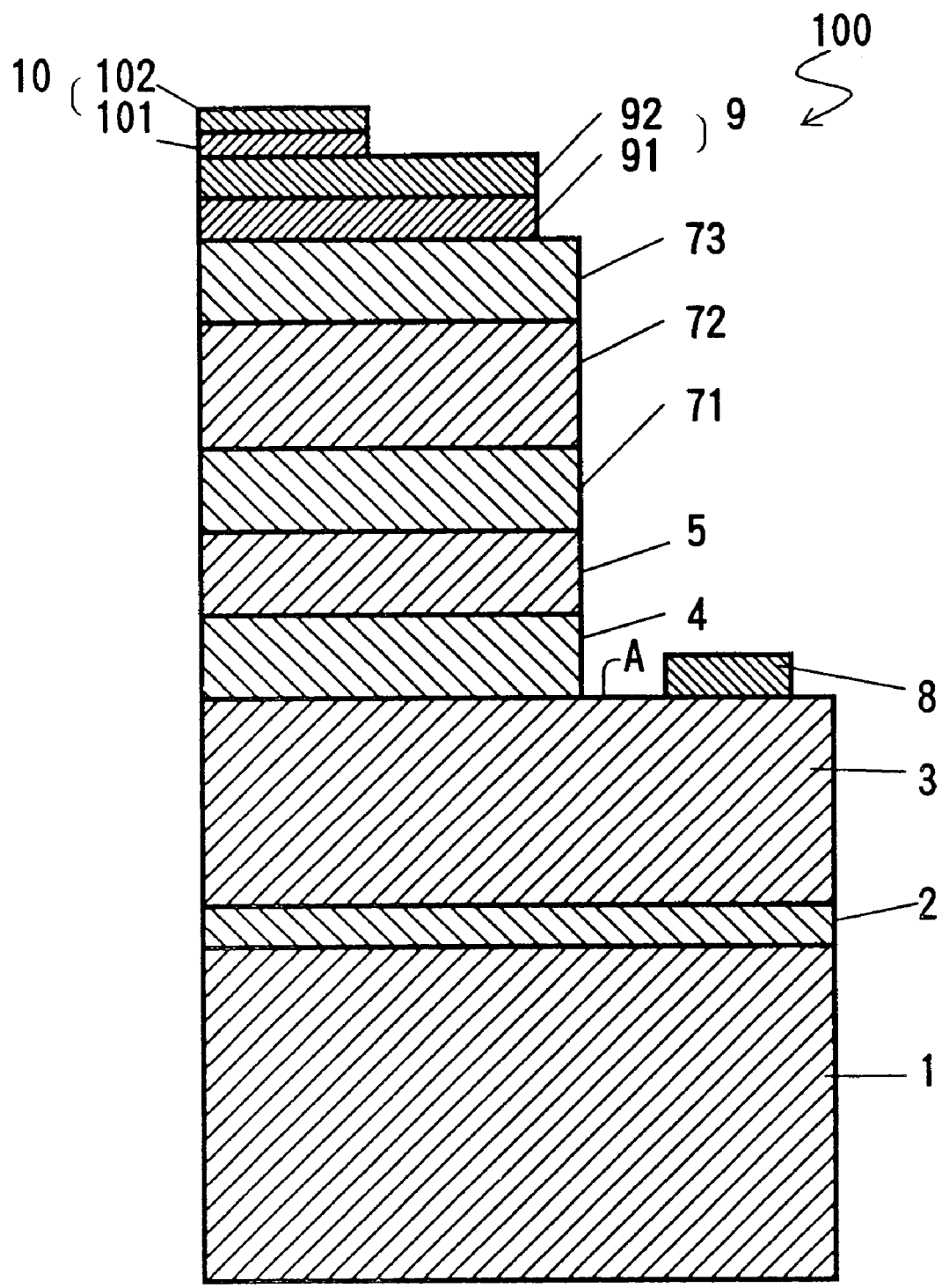
FIG. 1 is a sectional view showing the structure of a light-emitting diode (LED) in the example set forth below.

FIG. 1 shows a light-emitting diode (LED) 100 embodied in Example 1. It has a sapphire ($Al_2O_3$) substrate 1 upon which the following seven layers are consecutively formed: an AlN buffer layer 2; a Si doped GaN n$^+$-layer 3 of high carrier (n-type) concentration; a Si-doped n-layer 4 made of GaN; a Zn and Si-doped emission layer 5 made of $In_{0.20}Ga_{0.80}N$; a Mg-doped p-type cladding layer 71 made of $Al_{0.08}Ga_{0.92}N$; an Mg-doped first contact layer 72 made of GaN; and an Mg-doped second contact layer 73. The AlN layer 2 is about 0.05 $\mu$m in thickness. The n$^+$-layer 3 is about 4.0 $\mu$m in thickness and has an electron concentration of about $2\times10^{18}/cm^3$. The n-layer 4 is about 0.5 $\mu$m in thickness and has an electron concentration of about $5\times10^{17}/cm^3$. The emission layer 5 is about 100 nm in thickness and doped with Zn and Si in a concentration of $5\times10^{18}/cm^3$, respectively. The cladding layer 71 is about 10 nm in thickness and is doped with Mg in a concentration of about $5\times10^{19}/cm^3$ having a hole concentration of about $2\times10^{17}/cm^3$. The first contact layer 72 is about 35 nm in thickness and is doped with Mg in a concentration of about $5\times10^{19}/cm^3$ having a hole concentration of about $3\times10^{17}/cm^3$. The second contact layer 73 is about 5 nm in thickness and is doped with Mg in a concentration of about $1\times10^{20}/cm^3$ having a hole concentration of about $6\times10^{17}/cm^3$. A transparent electrode 9 with a double layer structure including a Ni layer 91 and an Au layer 92 is formed on the entire surface of the second contact layer 73. An electrode pad 10 with a double layer structure including a Ni layer 101 and an Au layer 102 is formed on a corner of the electrode 9 for wire bonding. An electrode 8 made of Al Is formed on some portion of the n$^+$-layer 3.

The LED 100 is manufactured by gaseous phase growth, called metalorganic vapor phase epitaxy referred to as MOVPE hereinafter.

The gases employed in this process are ammonia ($NH_3$), a carrier gas ($H_2$), trimethyl gallium ($Ga(CH_3)_3$) (TMG hereinafter), trimethyl aluminum ($Al(CH_3)_3$) (TMA hereinafter), trimethyl indium ($In(CH_3)_3$) (TMI hereinafter), silane ($SiH_4$), diethylzinc ($Zn(C_2H_5)_2$) (DEZ hereinafter) and biscyclopentadienyl magnesium ($Mg(C_5H_5)_2$) ($CP_2Mg$ hereinafter).

The single crystalline sapphire substrate 1, whose main surface 'a' was cleaned by an organic washing solvent and heat treatment, was placed on a susceptor in a reaction chamber for the MOVPE treatment. Then the sapphire substrate 1 was etched at 1100° C. by a vapor of $H_2$ fed into the chamber at a flow rate of 2 liter/min. under normal pressure for a period of 30 min.

About a 0.05 $\mu$m thick AlN buffer layer 2 was formed on the surface 'a' of the baked sapphire substrate 1 under conditions controlled by lowering the temperature in the chamber to 400° C., keeping the temperature constant, and concurrently supplying for a period of 90 sec. $H_2$ at a flow rate of 20 liter/min., $NH_3$ at 10 liter/min., and TMA at $1.8\times10^{-5}$ mol/min.

About a 4.0 $\mu$m thick Si-doped GaN layer was formed on the buffer layer 2, as an n$^+$-layer 3 of high carrier concentration with a Si concentration of about $4\times10^{18}/cm^3$ and an electron concentration of about $2\times10^{18}/cm^3$, under conditions controlled by keeping the temperature of the sapphire substrate 1 at 1150° C. and concurrently supplying for 40 min. $H_2$ at a flow rate of 20 liter/min., $NH_3$ at 10 liter/min., TMG at $1.7\times10^{-4}$ mol/min., and silane diluted to 0.86 ppm by $H_2$ at $20\times10^{-8}$ mol/min.

About a 0.5 $\mu$m thick Si-doped GaN was formed on the n$^+$-layer 3, as an n-type layer 4 with a Si concentration of about $1\times10^{18}/cm^3$ and an electron concentration of about $5\times10^{17}/cm^3$, under conditions controlled by keeping the temperature of the sapphire substrate 1 at 1100° C. and concurrently supplying for 30 min. $H_2$ at a flow rate of 20 liter/min., $NH_3$ at 10 liter/min., TMG at $1.12\times10^{-4}$ mol/min., and silane diluted to 0.86 ppm by $H_2$ at $10\times10^{-9}$ mol/min.

About a 100 nm thick $In_{0.20}Ga_{0.80}N$ layer was formed on the n-type cladding layer 4 as emission layer 5 with Si and Zn concentrations of about $5\times10^{18}/cm^3$ under conditions controlled by keeping the temperature of the sapphire substrate 1 at 800° C. and concurrently supplying for 30 min. $H_2$ at a flow rate of 20 liter/min., $NH_3$ at 10 liter/min., TMG at $0.2\times10^{-4}$ mol/min., TMI at $1.6\times10^{-4}$ mol/min., silane diluted to 0.86 ppm by $H_2$ at $0.15\times10^{-8}$ mol/min., and DEZ at $0.2\times10^{-6}$ mol/min.

About a 10 nm thick Mg-doped $Al_{0.08}Ga_{0.92}N$ layer, serving as a p-type cladding layer 71, was formed on the emission layer 5 under conditions controlled by keeping the temperature of the sapphire substrate 1 at 1100° C. and concurrently supplying for 2 min. $H_2$ at a flow rate of 20 liter/min., $NH_3$ at 10 liter/min., TMG at $0.5\times10^{-4}$ mol/min., TMA at $0.47\times10^{-5}$ mol/min., and $CP_2Mg$ at $2\times10^{-7}$ mol/min. The resistivity of the cladding layer 71 was $10^8$ Ω.cm or more, exhibiting insulating characteristics. The impurity concentration of Mg doped into the cladding layer 71 was $5\times10^{19}/cm^3$.

About a 35 nm thick Mg-doped GaN layer, serving as a first contact layer 72, was formed on the cladding layer 71 under conditions of keeping the temperature of the sapphire substrate 1 at 1100° C. and concurrently supplying for 4 min. $H_2$ at a flow rate of 20 liter/min., $NH_3$ at 10 liter/min., TMG at $0.5\times10^{-4}$ mol/min., and $CP_2Mg$ at $2\times10^{-8}$ mol/min. The resistivity of the first contact layer 72 was $10^8$ Ω.cm or more, exhibiting insulating characteristics. The impurity concentration of Mg doped into the first contact layer 72 was $5\times10^{19}/cm^3$.

About a 5 nm thick Mg-doped GaN layer, serving as a second contact layer 73, was formed on the first contact layer 72 under conditions of keeping the temperature of the sapphire substrate 1 at 1100° C. and concurrently supplying for 1 min. $H_2$ at a flow rate of 20 liter/min., $NH_3$ at 10 liter/min., TMG at $0.5\times10^{-4}$ mol/min., and $CP_2Mg$ at $4\times10^{-8}$ mol/min. The resistivity of the second contact layer 73 was $10^8$ Ω.cm or more, exhibiting insulating characteristics. The impurity concentration of Mg doped into the second contact layer 73 was $1\times10^{20}/cm^3$.

Then, electron rays were uniformly irradiated into the second contact layer 73, the first contact layer 72, and the cladding layer 71 using a reflective electron beam diffraction apparatus. The irradiation conditions were set at 10 kV for the accelerating voltage, 1 μA for the sample current, 0.2 mm/sec. for the speed of the beam scanning, 60 μmφ for the beam aperture, and at $5.0 \times 10^{-5}$ Torr vacuum. This irradiation changed the insulative three layers, the second contact layer 73, the first contact layer 72, and the cladding layer 71, to each be a p-type conductive semiconductor with respective hole concentrations of $6 \times 10^{17}/cm^3$, $3 \times 10^{17}$, and $2 \times 10^{17}/cm^3$ and respective resistivities of 0.7 Ω.cm, 1 Ω.cm, and 2 Ω.cm. As a result, a wafer with a multiple layer structure was obtained.

Figure 2:
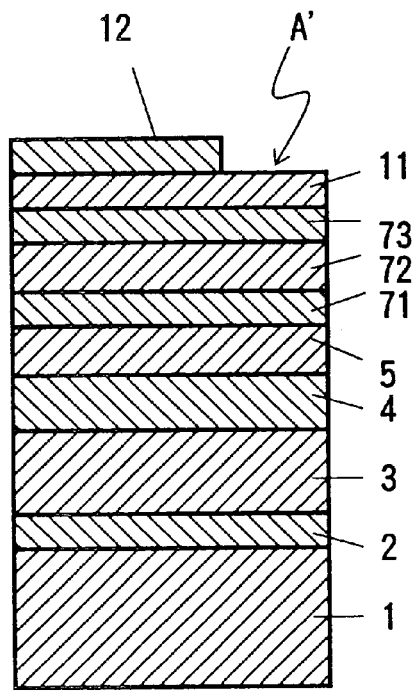
FIGS. 2 through 4 are sectional views illustrating in successive steps of forming producing the LED embodied in the example.

A $SiO_2$ layer 11 of about 2000 Å in thickness was formed by sputtering on the second contact layer 73 as shown in FIG. 2. Then, a photoresist layer 12 was laminated on the $SiO_2$ layer 11. A selected part or area of the photoresist layer 12 labeled A', was removed by photolithography as shown in FIG. 2. The part or area A' is an electrode forming part which corresponds to a place where a hole A, shown in FIG. 1, is formed reaching to the $n^+$-layer 3 of high carrier concentration.

Figure 3:
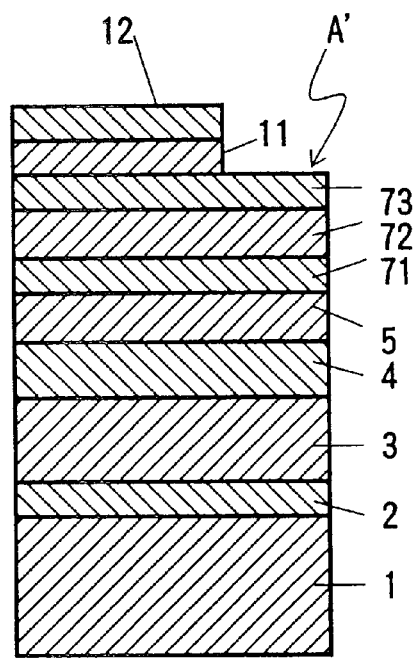
Figure 4:
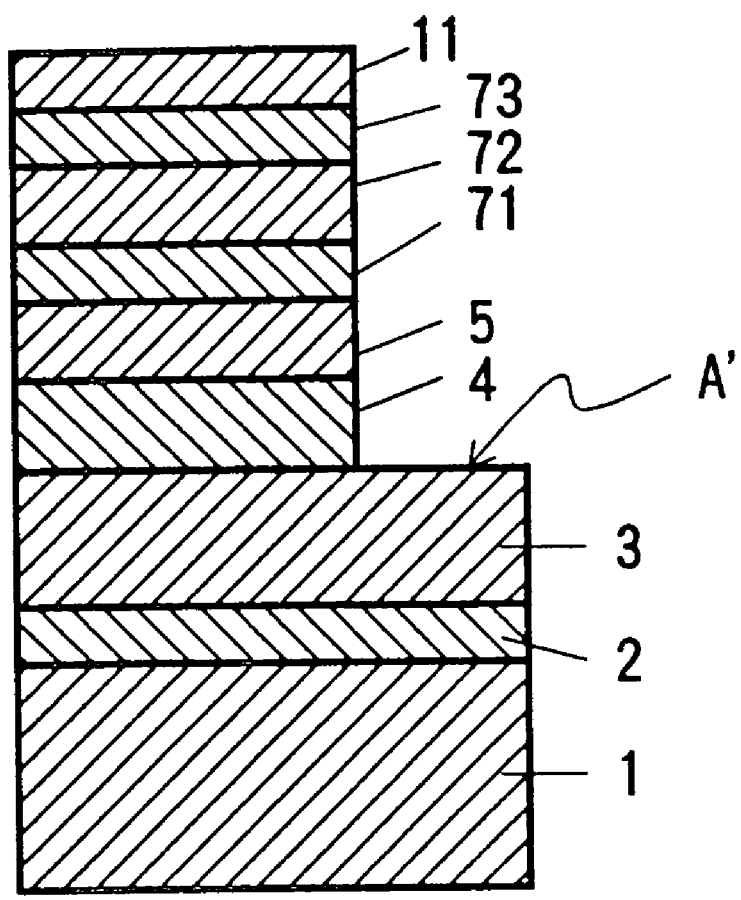

As shown in FIG. 3, a part of the $SiO_2$ layer 11 which was not covered with the photoresist layer 12 was etched off by an etching liquid such as hydrofluoric acid. Then, the exposed part of the second contact layer 73, the first contact layer 72, the cladding layer 71, the emission layer 5, and the n-layer 4, were removed by dry etching, or supplying a high-frequency power density of 0.44 $W/cm^2$ and $BCl_3$ gas of 10 ml/min. at a vacuum degree of 0.04 Torr as shown in FIG. 4. After that, dry etching with argon (Ar) was carried out on the wafer. Consequently, a hole A for forming an electrode reaching the $n^+$-layer 3 was formed. The photoresist layer 12 and the $SiO_2$ layer 11 remaining on the second contact layer 73 were removed by hydrofluoric acid.

A transparent electrode 9 with a double layer structure including a Ni layer 91 and an Au layer 92 was laminated on the entire surface of the second contact layer 73 by uniformly depositing a Ni layer 91 and an Au layer 92, laminating a photoresist layer, patterning by photolithography, and etching by acid. An electrode pad 10 with a double layer structure including a Ni layer 101 and an Au layer 102 was formed on some portion of the electrode 9. An Al electrode 8 was formed on the exposed portion of the $n^+$-layer 3 by vapor deposition. A wafer treated with the above-mentioned process was divided or diced into each element which shows a GaN LED 100 as shown in FIG. 1.

The obtained LED 100 was found to have a luminous intensity of 2000 mcd and a wavelength of 430 nm by driving current of 20 mA. The luminous intensity of the LED 100 was 2 fold of that of the conventional LED.

In the embodiment, the contact layer had a double layer structure including the first contact layer 72 and the second contact layer 73. Alternatively, the contact layer may have a single layer structure.

In the embodiment, the p-type layers, or the cladding layer 71, the first contact layer 72, and the second contact layer 73, had a 50 nm thickness and their growth temperature was 1100° C. taking 7 min. in total. The thickness of the p-type layers should preferably be in the range of 10 nm to 150 nm and take 1 min. to 20 min. to be formed. When the p-type layers as a whole are thinner than 10 nm, the cladding layer 71 cannot confine carriers and luminous efficiency is lowered, and the first contact layer 72 and the second contact layer 73 become thinner and ohmic characteristics develops an increasing poor contact resistance. When the p-type layers as a whole are thicker than 150 nm, crystallinity of the emission layer 5 becomes poor offsetting the effect of the present invention, because the emission layer 5 is exposed to high growth temperature for a long period.

Further in detail, the thickness of the cladding layer 71 should preferably be in the range of 2 nm to 70 nm. When it is thinner than 2 nm, the luminous efficiency becomes low because the cladding layer 71 can confine fewer carriers. The thickness of the first contact layer 72 should preferably be in the range of 2 nm to 100 nm. When it is thinner than 2 nm, the luminous efficiency becomes low, because the number of injected holes is reduced. The thickness of the second contact layer 73 should preferably be in the range of 2 nm to 50 nm. When it is thinner than 2 nm, the ohmic characteristics become poor and the contact resistance increases. When each of the p-type layers Is thicker than their upper limit, the crystallinity of the emission layer 5 becomes poor, because it is exposed to high growth temperature for a long period.

Further, hole concentration of the cladding layer 71 should preferably be in the range of $1 \times 10^{17}/cm^3$ to $1 \times 10^{18}/cm^3$. When the hole concentration is smaller than $1 \times 10^{17}/cm^3$, series resistance becomes high. When the hole concentration is larger than $1 \times 10^{18}/cm^3$, luminous efficiency is lowered, because the crystallinity of the cladding layer becomes poor due to the high impurity concentration.

The Mg concentration doped into the first contact layer 72 should preferably be in the range of $1 \times 10^{19}/cm^3$ to $5 \times 10^{20}/cm^3$ being smaller than that doped into the second contact layer 73, because the hole concentration can be maintained in the range of $3 \times 10^{17}/cm^3$ to $8 \times 10^{17}/cm^3$ which includes the maximum value and maintains high luminous efficiency.

The Mg concentration doped into the second contact layer 73 should preferably be in the range of $1 \times 10^{20}/cm^3$ to $1 \times 10^{21}/cm^3$, because the ohmic characteristic to the electrode 9 is improved and the driving voltage can be reduced to 5 V or less although the hole concentration of the second contact layer 73 is undesirably lowered to the range of $1 \times 10^{17}/cm^3$ to $8 \times 10^{17}/cm^3$. The range of Mg concentration can be adopted for the purpose lowering a driving voltage.

In the embodiment, the emission layer was made of $In_{0.20}Ga_{0.80}N$. Alternatively, the emission layer 5 may be made of any one of binary, ternary, and quaternary compounds of group III nitride compound semiconductor satisfying the formula $Al_{x1}Ga_{y1}In_{1-x1-y1}N$. The composition ratio of the emission layer, or x1 and y1, may take any arbitrary values within the range of $0 \leq x1 \leq 1$, $0 \leq y1 \leq 1$, and $0 \leq x1+y1 < 1$ including In.

In the embodiment, the p-type layers, or the cladding layer 71, the first contact layer 72, and the second contact layer 73, were made of $Al_{0.08}Ga_{0.92}N$, GaN, and GaN, respectively. Alternatively, the p-type layers may be made of any one of two, three, and four elements of group III nitride compound semiconductor satisfying the formula $Al_{x2}Ga_{y2}In_{1-x2-y2}N$ taking any arbitrary composition ratio within the range of $0 \leq x2 \leq 1$, $0 \leq y2 \leq 1$, and $0 \leq x2+y2 \leq 1$ only if the band gap of the p-type layers is designed to be wider than that of the emission layer 5.

The impurity concentration of each of Si and Zn doped into the emission layer 5 should preferably be in the range of $1 \times 10^{17}/cm^3$ to $1 \times 10^{20}/cm^3$. When it is smaller than $1 \times 10^{17}/cm^3$, luminous efficiency is lowered, because luminous center in the emission layer 5 is reduced. When it is larger than $1 \times 10^{20}/cm^3$, crystallinity of the emission layer 5 becomes poor and Auger effect appears. More preferably, the impurity concentration of each of Si and Zn doped into the emission layer 5 should be in the range of $1 \times 10^{18}/cm^3$ to $1\times10^{19}/cm^3$. Further, the concentration of Si should preferably be 10 times to one tenth of that of Zn and more preferably the concentration of Si should be one to one tenth of that of Zn.

In the embodiment, the emission layer 5 was doped with Zn and Si. Alternatively, the emission layer 5 may be a non-doped layer. The emission layer 5 had a single layer structure in the embodiment. Alternatively, the emission layer 5 may have a single quantum well or multi-quantum well structure including a well satisfying the formula $Al_{x5}Ga_{y5}In_{1-x5-y5}N$ wherein $0 \leq x5 \leq 1$, $0 \leq y5 \leq 1$, and $0 \leq x5+y5<1$ and a barrier satisfying the formula $Al_{x6}Ga_{y6}In_{1-x6-y6}N$ wherein $0 \leq x6 \leq 1$, $0 \leq y6 \leq 1$, and $0 \leq x6-y6 \leq 1$. In this case, one of the well and the barrier may be doped with both an acceptor and a donor impurities, only the well may be doped with one of the acceptor and the donor impurities, the barrier may be doped with one of the donor and the acceptor impurities, and the both of the well and the barrier may be non-doped layers.

In the embodiment, Zn and Mg were used as acceptor impurities and Si as a donor impurity. Alternatively, group II elements such as beryllium (Be), cadmium (Cd), and mercury (Hg) can be used as an acceptor impurity and group IV elements such as carbon (C), germanium (Ge), tin (Sn), and lead (Pb) can be used as a donor impurity. When the group IV elements are used as an acceptor impurity, group VI elements such as sulfur (S), selenium (Se), and tellurium (Te) can be used as a donor impurity, alternatively.

Electron irradiation was used in the embodiment to process the cladding layer 71 and the first and the second contact layers 72 and 73 to exhibit p-type conduction. Alternatively, annealing, heat processing in the atmosphere of $N_2$ plasma gas and laser irradiation can be used.

In the embodiment, the LED 100 was described in detail. The present invention may be applied to a laser diode (LD) as well.

While the invention has been described in connection with specific exemplary embodiments, it is to be understood that the invention is not to be limited to the disclosed embodiments. Rather, the present invention is intended to include various modifications and equivalent arrangements, such as those that are within the spirit and scope of the appended claims.

What is claimed is:

1. A light-emitting device using group III nitride compound semiconductor, comprising:

an emission layer of group III nitride compound semiconductor satisfying the formula $Al_{x1}Ga_{y1}In_{1-x1-y1}N$, inclusive of $0 \leq x1 \leq 1$, $0 \leq y1 \leq 1$ and $0 \leq x1+y1 \leq 1$;

a cladding layer formed on said emission layer and made of group III nitride compound semiconductor satisfying the formula $Al_{x2}Ga_{y2}In_{1-x2-y2}N$, inclusive of $0 \leq x2 \leq 1$, $0 \leq y2 \leq 1$ and $0 \leq x2+y2 \leq 1$;

a contact layer formed on said cladding layer and made of group III nitride compound semiconductor satisfying the formula $Al_{x3}Ga_{y3}In_{1-x3-y3}N$, inclusive of $0 \leq x3 \leq 1$, $0 \leq y3 \leq 1$ and $0 \leq x3+y3 \leq 1$; and wherein total thickness of said cladding layer and said contact layer is in the range of 10 nm to 150 nm.

2. A light-emitting device of claim 1, wherein said cladding layer is doped with an acceptor impurity and exhibits p-type conduction.

3. A light-emitting device of claim 1, wherein said contact layer is doped with an acceptor impurity and exhibits p-type conduction.

4. A light-emitting device of claim 1, wherein said cladding layer is made of a three element compound satisfying the formula $Al_{y4}Ga_{1-y4}N$ where $0 \leq y4 \leq 1$.

5. A light-emitting device of claim 1, wherein said contact layer is made of gallium nitride (GaN).

6. A light-emitting device of claim 2, wherein said acceptor impurity is magnesium (Mg).

7. A light-emitting device of claim 3, wherein said acceptor impurity is magnesium (Mg).

8. A light-emitting-device of claim 1, wherein said emission layer is doped with an acceptor impurity and a donor impurity.

9. A light-emitting device of claim 8, wherein said acceptor impurity is zinc (Zn) and said donor impurity is silicon (Si).

10. A light-emitting device of claim 1, wherein said emission layer has one of a single quantum well structure and a multi-quantum well structure.

11. A light-emitting device or claim 1, wherein said emission layer is a non-doped layer.

12. A light-emitting device of claim 10, wherein said emission layer is a non-doped layer.

13. A light-emitting device of claim 7, wherein said contact layer has a double layer structure including a first contact layer doped with magnesium (Mg) in the range of $1\times10^{19}/cm^3$ to $5\times10^{20}/cm^3$ and a second contact layer doped with magnesium (Mg) in the range of $1\times10^{20}/cm^3$ to $1\times10^{21}/cm^3$.

* * * * *